(12) United States Patent
Moon et al.

(10) Patent No.: US 9,362,477 B2
(45) Date of Patent: Jun. 7, 2016

(54) METHOD OF FORMING CERAMIC WIRE, SYSTEM OF FORMING THE SAME, AND SUPERCONDUCTOR WIRE USING THE SAME

(75) Inventors: Seung-Hyun Moon, Seongnam-si (KR); Hun-Ju Lee, Seongnam-si (KR); Sang-Im Yoo, Seoul (KR); Hong-Soo Ha, Changwon-si (KR)

(73) Assignee: SUNAM CO., LTD., Anseong-si, Gyeonggi-do (KR)

( * ) Notice: Subject to any disclaimer, the term of this patent is extended or adjusted under 35 U.S.C. 154(b) by 303 days.

(21) Appl. No.: 13/577,290

(22) PCT Filed: Aug. 3, 2010

(86) PCT No.: PCT/KR2010/005103
§ 371 (c)(1),
(2), (4) Date: Sep. 6, 2012

(87) PCT Pub. No.: WO2011/096624
PCT Pub. Date: Aug. 11, 2011

(65) Prior Publication Data
US 2012/0329658 A1      Dec. 27, 2012

(30) Foreign Application Priority Data

Feb. 5, 2010 (KR) .................. 10-2010-0011151
Aug. 3, 2010 (KR) .................. 10-2010-0074924

(51) Int. Cl.
*H01L 39/24* (2006.01)
*C04B 35/45* (2006.01)
(Continued)

(52) U.S. Cl.
CPC ........ *H01L 39/2451* (2013.01); *C04B 35/4508* (2013.01); *C04B 35/62231* (2013.01); *C23C 14/562* (2013.01); *C23C 14/5806* (2013.01); *C23C 14/5853* (2013.01); *H01L 39/143* (2013.01); *C04B 2235/3215* (2013.01);
(Continued)

(58) Field of Classification Search
CPC .................................................... C04B 35/4508
USPC .................................. 505/440, 441, 445, 446
See application file for complete search history.

(56) References Cited

U.S. PATENT DOCUMENTS

| 5,270,296 A | 12/1993 | Hed |
| 6,974,501 B1 * | 12/2005 | Zhang et al. .................... 117/84 |

(Continued)

FOREIGN PATENT DOCUMENTS

| EP | 1 990 809 A1 | 11/2008 |
| JP | 64-072905 A | 3/1989 |

(Continued)

OTHER PUBLICATIONS

International Search Report (ISR) for PCT/KR2010/005103 published Aug. 11, 2011. (Moon, et al.).

*Primary Examiner* — Paul Wartalowicz
(74) *Attorney, Agent, or Firm* — Lee & Morse, P.C.

(57) ABSTRACT

Provided is a method of forming a ceramic wire. In the method, a ceramic precursor film is deposited on a wire substrate. Then, the wire substrate on which the ceramic precursor film is deposited is treated by heating. For treating the wire substrate by heating, a temperature of the wire substrate and/or an oxygen partial pressure of the wire substrate are controlled such that the ceramic precursor film is in a liquid state and an epitaxy ceramic film is formed from the liquid ceramic precursor film on the wire substrate.

7 Claims, 5 Drawing Sheets

(51) Int. Cl.
*C04B 35/622* (2006.01)
*C23C 14/56* (2006.01)
*C23C 14/58* (2006.01)
*H01L 39/14* (2006.01)

(52) U.S. Cl.
CPC . *C04B2235/3224* (2013.01); *C04B 2235/3281* (2013.01); *C04B 2235/6584* (2013.01)

(56) References Cited

U.S. PATENT DOCUMENTS

| | | | |
|---|---|---|---|
| 2003/0127051 A1 | 7/2003 | Fritzemeier et al. | |
| 2004/0255855 A1* | 12/2004 | Selvamanickam et al. | 118/715 |
| 2005/0065035 A1* | 3/2005 | Rupich et al. | 505/300 |
| 2005/0223984 A1* | 10/2005 | Lee et al. | 118/715 |
| 2006/0040829 A1 | 2/2006 | Rupich et al. | |

FOREIGN PATENT DOCUMENTS

| | | |
|---|---|---|
| JP | 01-274320 A | 11/1989 |
| JP | 05-074233 A | 3/1993 |
| JP | 06-23459 A | 2/1994 |
| JP | 06-112713 A | 4/1994 |
| JP | 2003-327496 A | 11/2003 |
| JP | 2005-1947 A | 1/2005 |
| JP | 2007-220467 A | 8/2007 |
| KR | 10-0249782 B1 | 3/2000 |
| KR | 10-2002-0011484 A | 2/2002 |
| KR | 10-2005-0117822 A | 12/2005 |
| KR | 10-2006-0117088 A | 11/2006 |
| KR | 10-2008-0047101 A | 5/2008 |
| RU | 2 232 448 C2 | 6/1998 |
| RU | 2 386 732 C1 | 4/2010 |
| WO | WO 94/23459 | 10/1994 |
| WO | WO 98/58415 | 12/1998 |
| WO | WO 2005/001947 A2 | 1/2005 |
| WO | WO 2005/007918 A2 | 1/2005 |

* cited by examiner

METHOD OF FORMING CERAMIC WIRE, SYSTEM OF FORMING THE SAME, AND SUPERCONDUCTOR WIRE USING THE SAME

TECHNICAL FIELD

The present disclosure herein relates to a ceramic wire.

BACKGROUND ART

A superconductor loses all its resistance below critical temperature and a large amount of an electric current may pass through the superconductor without loss. Recently, a second generation high temperature superconducting wire (Coated Conductor) including a superconducting layer on a metal substrate or on a thin buffer layer including a biaxially aligned textured structure has been studied. Compared to a metal conductor, the second generation high temperature superconducting wire can transmit much more electric current per unit area of its cross-section. The second generation high temperature superconducting wire may be used in a superconducting power transmission and distribution cable with low power loss, a magnetic resonance imaging (MRI), a magnetic levitation train, a superconducting propulsion ship, etc.

DISCLOSURE OF INVENTION

Technical Problem

The present disclosure provides ceramic wires including a thick ceramic layer.

The present disclosure also provides methods of forming a ceramic wire.

The present disclosure further provides systems for forming a ceramic wire.

Solution to Problem

Embodiments of the inventive concept provide methods of forming ceramic wires. In the methods, a metal or ceramic precursor film is deposited on a wire substrate. Then, the wire substrate on which the ceramic precursor film is deposited is heat-treated. For heat-treating the wire substrate, a temperature of the wire substrate and/or an oxygen partial pressure of a processing chamber, in which the wire substrate is provided, are controlled such that the ceramic precursor film is in a liquid state and an epitaxial ceramic film is formed from the liquid ceramic precursor film on the wire substrate.

Some embodiments of the inventive concept provide superconductor wires. The superconductor wire may include a substrate having a tape shape, a buffer layer on the substrate and a superconducting layer on the buffer layer, including one of rare earth elements, barium and copper. The superconducting layer may include a first portion adjacent to the buffer layer, having a superconducting phase; and a second portion on the first portion, having a phase different from the superconducting phase.

Other embodiments of the inventive concept provide systems of forming a ceramic wire. The system includes a film deposition unit forming a ceramic film on a wire substrate and a heat treatment unit treating the wire substrate having the ceramic film by heating. The heat treatment unit may include a first container, a second container and a third container which pass the wire substrate in order and are adjacent to each other. The first container, the second container and the third container may be independently pumped to independently maintain a vacuum state, and temperatures in the first container, the second container and the third container are independently controlled.

Advantageous Effects of Invention

According to the present disclosure, a ceramic wire of a thick ceramic layer can be rapidly formed.

BEST MODE FOR CARRYING OUT THE INVENTION

Figure 1:
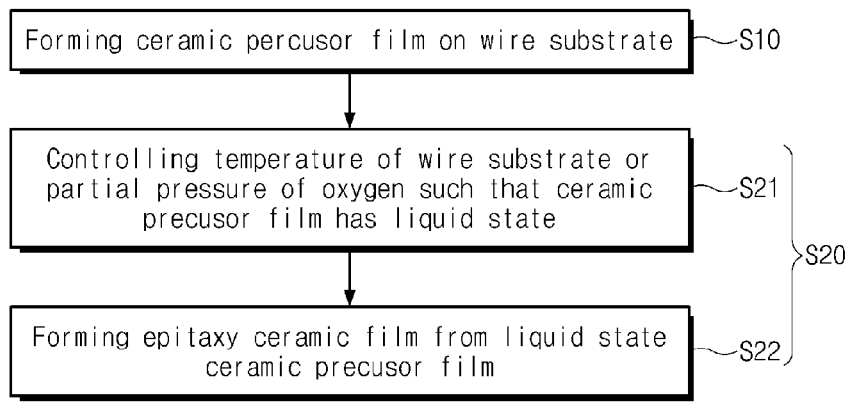
FIG. 1 is a flow chart illustrating a method of forming a ceramic wire in accordance with embodiments of the present inventive concept.

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. Also, since exemplary embodiments are described, reference numerals disclosed according to the sequence of description are not limited to the sequence.

In the inventive concept, a representative of ceramic materials may be superconductor. However, the ceramic material is not limited to the superconductor. In the following embodiments, a superconductor will be described as an example of ceramic material. The present disclosure describes YBCO and SmBCO as examples of superconductors. In the exemplary embodiments of the inventive concept, although the YBCO and the SmBCO have been described as examples of the ceramic film, the inventive concept is not limited to the YBCO ceramic film and the SmBCO ceramic film. The superconductor may comprise $ReBa_2Cu_3O_{7-x}$ wherein $0 \le x \le 0.5$, $0 \leq y \leq 0.5$. The rare earth element (Re) may include yttrium (Y), elements in the lanthanide series, or a combination thereof. The elements in the lanthanide series include lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), etc.

Figure 2:
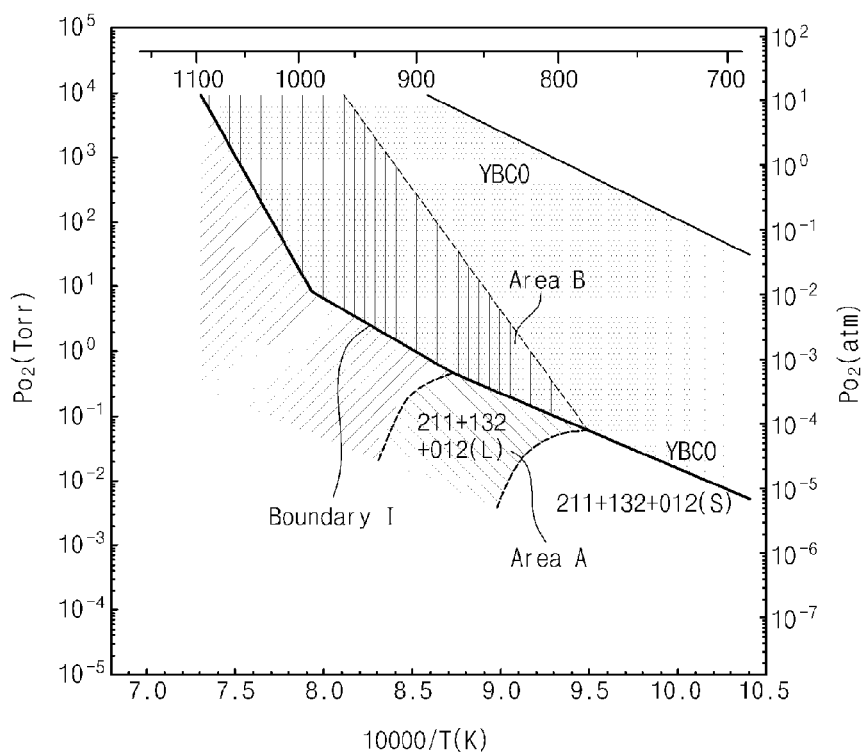
FIG. 2 is a phase diagram illustrating an yttrium barium copper oxide (YBCO)

FIG. 1 is a flow chart illustrating a method of forming a ceramic wire in accordance with embodiments of the present inventive concept. FIG. 2 is a phase diagram illustrating an yttrium barium copper oxide (YBCO). A method of forming a ceramic wire in accordance with exemplary embodiments of the inventive concept will be briefly described with reference to FIGS. 1 and 2.

In a first step (S 10), a ceramic precursor film is formed on a wire substrate. It can be understood that the ceramic precursor film may be in an amorphous state which is not crystallized. The wire substrate may be a base material substrate having a biaxially aligned textured structure. The base material substrate may include a metal substrate having a textured structure, a single crystalline substrate or an oxide buffer layer including a textured structure provided on a metal substrate. The metal or the single crystalline substrate may include a cubic lattice metal, such as nickel (Ni), nickel alloy (Ni—W, Ni—Cr, Ni—Cr—W, etc.), silver (Ag), silver alloy, nickel-silver composites which are hot rolled. The oxide buffer layer is formed on Ni, Ni-alloy or stainless-steel. The oxide buffer layer may include a ceramic interlayer, MgO, $LaAlO_3$, $LaMnO_3$ or $SrTiO_3$, etc. The buffer layer prevents a reaction of the base material substrate and a ceramic material on the base material substrate and transfers crystalline properties of the biaxially aligned textured structure.

The ceramic precursor film may be formed by various methods. For example, the ceramic precursor film may be formed by a co-evaporation method, a laser ablation method, a chemical vapor deposition (CVD) method, a metal organic deposition (MOD) method, or a sol-gel method.

In an exemplary embodiment, the ceramic precursor film may be formed by the co-evaporation method. For depositing the ceramic precursor film, the co-evaporation method may include providing metal vapor which is generated by irradiating electron beam onto crucibles containing at least one of rare earth elements, copper (Cu) and barium (Ba). The rare earth elements may include yttrium (Y), elements in the lanthanide series, or a combination thereof. The elements in the lanthanide series include lanthanum (La), neodymium (Nd), samarium (Sm), europium (Eu), gadolinium (Gd), terbium (Tb), dysprosium (Dy), holmium (Ho), erbium (Er), thulium (Tm), ytterbium (Yb), lutetium (Lu), etc.

In another exemplary embodiment, the ceramic precursor film may be formed by the MOD method. For example, a metal precursor solution is prepared by dissolving rare earth element-acetate, barium-acetate and copper-acetate in a solvent, evaporating and distilling the dissolved solution, and refluxing the distilled vapor. The metal precursor solution is deposited on the wire substrate.

Referring to FIG. 2, it may be understood that the REBCO, which is the ceramic precursor film formed by the first step (S 10), is decomposed into $RE_2BaCuO_5$ (hereinafter, referred to as '211', $REBa_3Cu_2O_6$ (hereinafter, referred to as '132' and $BaCu_2O_2$ (hereinafter, referred to as '012'. The '012' is in a solid state at a low temperature. That is, during a process of decomposing the REBCO, a solid '012' appears. The '012' is liquid in hatched regions. In a gray region, REBCO is thermodynamically stable.

In a second step (S 20), the wire substrate on which the ceramic precursor film is deposited is treated by heating. An oxygen partial pressure and/or a heat treatment temperature are controlled such that the '012' of the decomposition components of the REBCO is in the liquid state (S 21). The '211' and '132' are dissolved in the '012'(refer to an area A shown in FIG. 2). By controlling the oxygen partial pressure and/or the heat treatment temperature, a stable epitaxial REBCO layer is formed from the liquid '012' at the boundary I (S 22). More particularly, nuclei are formed from the '211' and '132' dissolved in the liquid '012' on the wire substrate so that the REBCO layer epitaxially grows (refer to an area B shown in FIG. 2).

Figure 3:
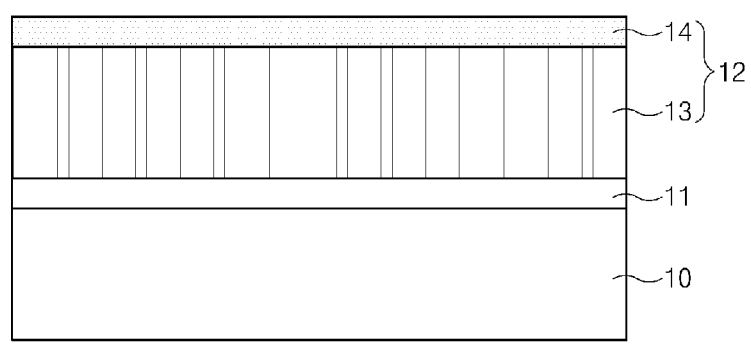
FIG. 3 is a cross-sectional view illustrating a ceramic wire in accordance with embodiments of the inventive concept.

Referring to FIG. 3, a buffer layer 11 is formed on the wire substrate 10. The REBCO layer 12 is formed on the buffer layer 11. The REBCO layer 12 may include a first portion 13 adjacent to the buffer layer, and a second portion 14 in the first portion 13. The first portion 13 may have a superconducting phase. The second portion 14 may have a phase different from the superconducting phase. For example, in the first portion 13, a ratio of the rare earth element, the barium and the copper is about 1:2:3. In second portion 14, a ratio of the rare earth element, the barium and the copper is different from the first portion 13. While the REBCO epitaxially grows from the '211' and '132' dissolved in the liquid '012' at a lower portion of the REBCO layer 12, the ceramic precursor remains at an upper portion of the REBCO layer. Therefore, an upper surface of final REBCO layer may be the second portion 14 and may include a nonstoichiometric oxide which is a trace of the ceramic precursor. The second portion 14 may include at least one phase which has a crystal structure different from that of the first portion 13. The first portion 13 may further include grains of $RE_2O_3$.

In the method of forming the REBCO as described above, the ceramic precursor film may be formed such that a ratio of the rare earth element, barium and copper is about 1:x:3 ($0 \leq x \leq 2$). For example, the ceramic precursor film may be formed such that a ratio of the rare earth element, barium and copper is about 1:1.5:3. Since the REBCO precursor of which a ratio of the rare earth element, barium and copper is about 1:2:3 generally decomposes in the air, the REBCO precursor including the ratio of about 1:2:3 is unstable. In contrast to the REBCO precursor including the ratio of about 1:2:3, the REBCO precursor of which a ratio of the rare earth element, barium and copper is about 1:1.5:3 is stable in the air. Therefore, although the REBCO precursor film having the ratio of about 1:2:3 should be under a vacuum before the heat treatment process of the REBCO precursor film, the REBCO precursor film having the ratio of about 1:1.5:3 can be exposed to the air before the heat treatment process of the REBCO precursor film. The REBCO precursor film having the ratio of about 1:x:3 ($1 \leq x \leq 2$) may become a REBCO superconducting film including the first portion 13 of which the ratio of the rare earth element, the barium and the copper is about 1:2:3 and a second portion 14 of which the ratio of the rare earth element, the barium and the copper is different from the first portion 13 by the heat treatment process as described above. When the REBCO precursor film having the ratio of about 1:x:3 ($1 \leq x \leq 2$) becomes the REBCO superconducting film, the second portion 14 may include the solid '012'. The '211' and 'the 132' may be consumed during the epitaxial growth of the first portion 13.

Figure 4:
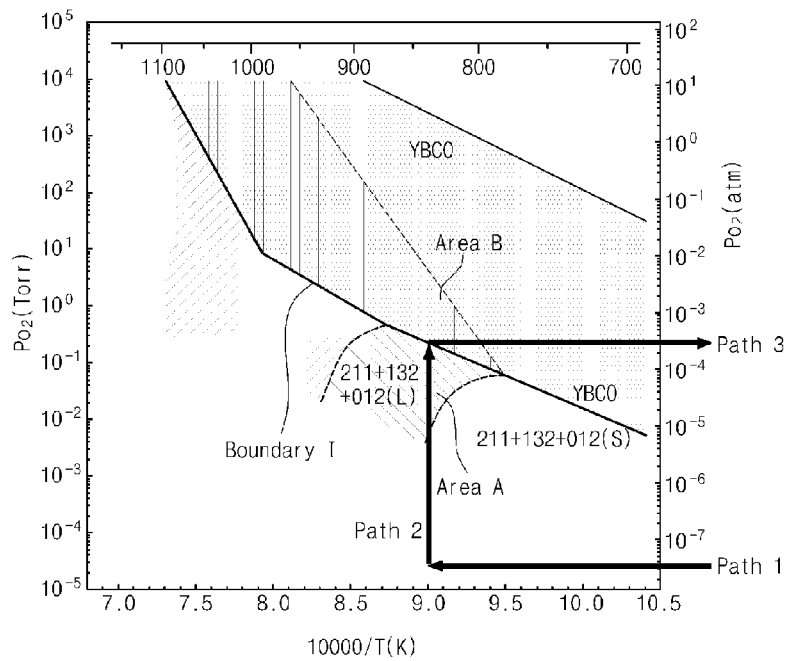
FIG. 4 is a phase diagram illustrating a method for forming YBCO in accordance with an exemplary embodiment of the inventive concept.
Figure 5:
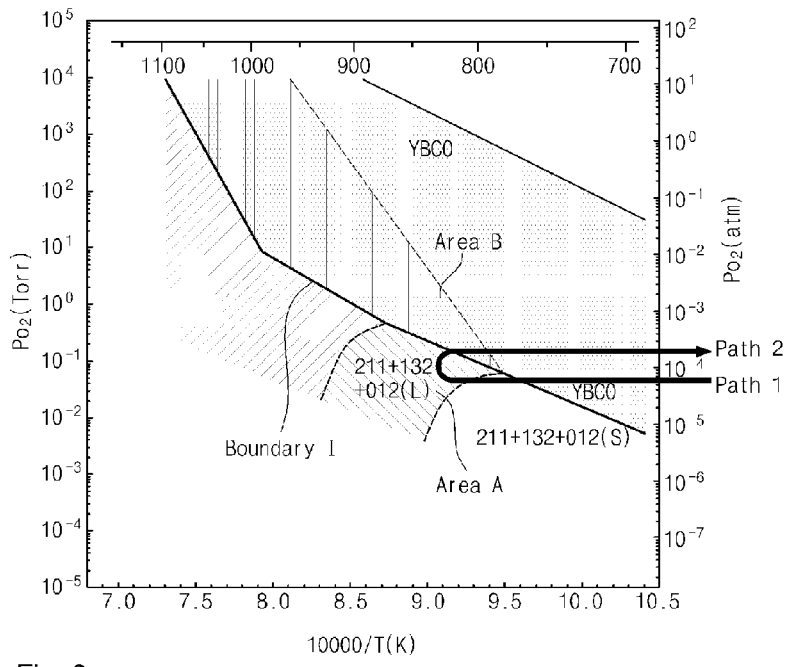
FIG. 5 is a phase diagram illustrating a method for forming YBCO in accordance with another exemplary embodiment of the inventive concept.

A method of the ceramic wire in accordance with exemplary embodiments of the inventive concept will be described in detail with reference to examples of various heat treatment paths in the YBCO phase diagram of FIG. 2. FIGS. 4 and 5 are YBCO phase diagrams and illustrate methods of forming ceramic wires in accordance with exemplary embodiments of the inventive concept.

Methods of forming ceramic wires in accordance with exemplary embodiments of the inventive concept will be described with reference to FIGS. 1 and 4.

In a first step (S 10), as described above, a ceramic precursor film is formed on the wire substrate. The ceramic precursor film formed in the first step S10 includes REBCO which is decomposed into $RE_2BaCuO_5$ (hereinafter, referred to as '211'), $REBa_3Cu_2O_6$ (hereinafter, referred to as '132') and $BaCu_2O_2$ (hereinafter, referred to as '012'). The '012' is in the solid state at a low temperature. That is, during a process of decomposing the REBCO, a solid '012' appears.

In a second step (S 20), the wire substrate on which the ceramic precursor film is deposited is treated by heating. The heat treatment process of the wire substrate may be performed according to a path 1 of the phase diagram shown in FIG. 4. The heat treatment process according to the path 1 may be performed under a relatively low oxygen partial pressure. For example, the heat treatment process may be performed at the oxygen partial pressure of about $1 \times 10^{-5}$ Torr to $1 \times 10^{-4}$ Torr. A temperature of the heat treatment process may increase from a room temperature to about 800° C.

An oxygen partial pressure and/or a heat treatment temperature are controlled according to a path 2 of the phase diagram shown in FIG. 4 such that the '012' of the decomposition components of the REBCO is in the liquid state (S 21). For example, the oxygen partial pressure may be increased to about $1 \times 10^{-2}$ Torr to about $3 \times 10^{-1}$ Torr. The temperature of the heat treatment process may be higher than 800° C. At this time, the REBCO may include the '211' and '132' dissolved in the liquid '012'.

Since the oxygen partial pressure and/or the heat treatment temperature are controlled along a path 3 of the phase diagram shown in FIG. 4, which crosses the boundary I, a stable epitaxial REBCO film may be formed from the liquid '012' (S 22). For example, the oxygen partial pressure may be in a range of about $5 \times 10^{-2}$ Torr to about $3 \times 10^{-1}$ Torr. The heat treatment temperature may be decreased to about 800° C. or less, for example, to room temperature. More particularly, nucluei are generated from the '211' and '132' dissolved in the liquid '012' on the wire substrate so that the REBCO layer epitaxially grows.

FIG. 5 is a phase diagram illustrating an YBCO formed by a method in accordance with another exemplary embodiment of the inventive concept.

Methods of forming ceramic wires in accordance with exemplary embodiments of the inventive concept will be described with reference to FIGS. 1 and 5. Any repetitive explanation concerning technical features and functions which are the same as those of the above-described exemplary embodiments will be omitted.

In a first step (S 10), in the same manner as the exemplary embodiments described above, a ceramic precursor film is formed on a wire substrate. In a second step (S 20), the wire substrate on which the ceramic precursor film is formed is treated by heating. The heat treatment process may be performed according to paths of the phase diagram shown in FIG. 5. For example, the heat treatment process according to a path 1 may be performed under an oxygen partial pressure of about $5 \times 10^{-2}$ Torr to about $3 \times 10^{-1}$ Torr. The heat treatment temperature may be increased from a room temperature to about 800° C. or more. The oxygen partial pressure and/or the heat treatment temperature are controlled according to the path 1 so that the '012' may be in a liquid state. At this time, the REBCO may include the '211' and '132' dissolved in the liquid '012' (S 21).

Since the oxygen partial pressure and/or the heat treatment temperature are controlled according to a path 2 of the phase diagram shown in FIG. 5, which crosses the boundary I, a stable REBCO layer may be formed (S 22). For example, the oxygen partial pressure may be in a range of about $5 \times 10^{-2}$ Torr to about $3 \times 10^{-1}$ Torr. The heat treatment temperature may be decreased to about 800° C. or less, for example, to room temperature. More particularly, nucluei are generated from the '211' and '132' dissolved in the liquid '012' on the wire substrate so that the REBCO layer epitaxially grows.

Growth processes of the REBCO layer in accordance with exemplary embodiments described above is similar to a liquid phase epitaxy (LPE). Since FIGS. 2, 4 and 5 are phase diagrams of YBCO, the oxygen partial pressure and the heat treatment temperature may vary according to the rare earth elements.

A system of forming a ceramic wire in accordance with an exemplary embodiment of the inventive concept will be described with reference to FIGS. 6 to 9. The system of forming the ceramic wire described with reference to FIGS. 6 to 9 is one exemplary embodiment of the inventive concept and the inventive concept is not limited to the system of forming the ceramic wire described with reference to FIGS. 6 to 9.

Figure 6:
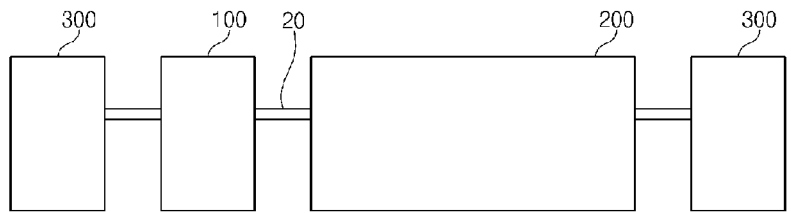
FIG. 6 is a block diagram illustrating an apparatus of forming a ceramic wire in accordance with exemplary embodiments of the inventive concept.

FIG. 6 is a block diagram illustrating an apparatus of forming a ceramic wire in accordance with exemplary embodiments of the inventive concept. Referring to FIG. 6, an apparatus of forming a ceramic wire includes a film deposition unit 100, a heat treatment unit 200 and a wire supply/collection unit 300. The film deposition unit 100 forms a ceramic precursor film on a wire substrate. The heat treatment unit 200 thermally treats the wire substrate on which the ceramic precursor film is formed. A vacuum pipe 20 may be further provided between the film deposition unit 100, the heat treatment unit 200 and the wire supply/collection unit 300. The vacuum pipe 20 maintains a vacuum state and the wire substrate 10 passes through the vacuum pipe 20.

Figure 7:
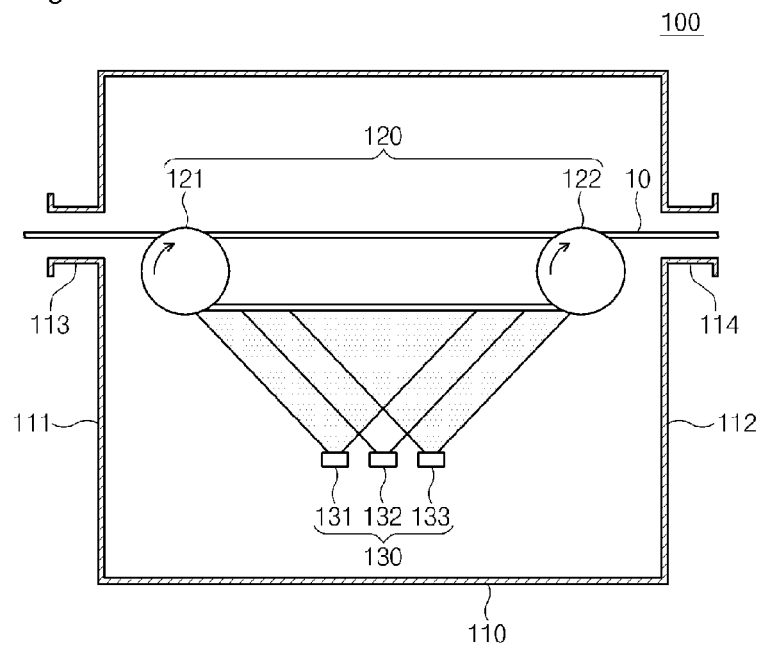
FIG. 7 is a cross-sectional view illustrating a film deposition unit of the apparatus of forming a ceramic wire in accordance with exemplary embodiments of the inventive concept.

FIG. 7 is a cross-sectional view illustrating the film deposition unit 100 of the apparatus of forming a ceramic wire in accordance with exemplary embodiments of the inventive concept. Referring to FIGS. 6 and 7, the film deposition unit 100 includes a process chamber 110, a reel to reel apparatus 120, and a deposition member 130. For example, the process chamber 110 provides a space in which a deposition process for forming the ceramic precursor film on the wire substrate 10 is performed. The process chamber 110 includes a first sidewall 111 and a second sidewall 112 which face each other. The first sidewall 111 is provided with an incoming part 113 which is connected to the wire supply/collection unit 300. The second sidewall 112 is provided with an outgoing part 114 which is connected to the heat treatment unit 200. The wire substrate 10 is transported from the wire supply/collection unit 300 to enter the process chamber 110 through the incoming part 113. Then, the wire substrate 10 gets out from the process chamber 110 through the outgoing part 114 to enter the heat treatment unit 200.

The deposition member 130 may be provided under the reel to reel device 120. The deposition member 130 provides vapor of the ceramic material to a surface of the wire substrate 10. In an exemplary embodiment, the deposition member 130 may provide the ceramic precursor film on the wire substrate 10, using the co-evaporation method. The deposition member 130 may include metal vapor sources 131, 132 and 133 which provide metal vapor under the wire substrate 10 using electron beam. The metal vapor sources may include sources for the rare earth element, the barium and the copper.

Figure 8:
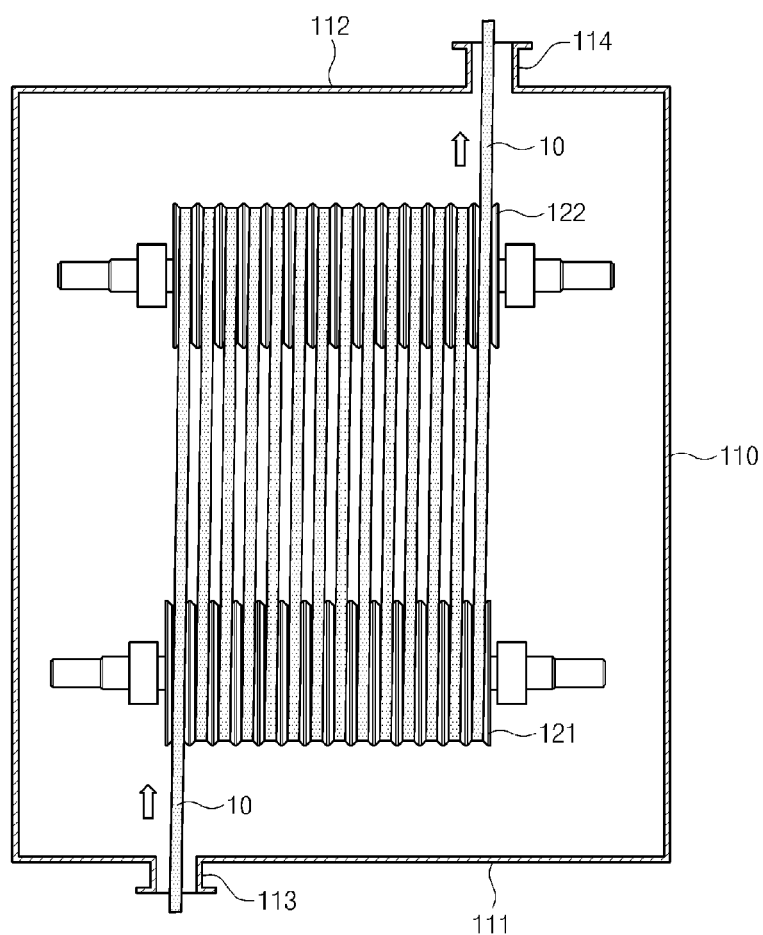
FIG. 8 is a plan view illustrating a reel to reel apparatus in accordance with exemplary embodiments of the inventive concept.

FIG. 8 is a plan view of a reel to reel apparatus in accordance with exemplary embodiments of the inventive concept. Referring to FIGS. 7 and 8, the reel to reel device includes a first reel member 121 and a second reel member 122. The first and second reel members 121 and 122 facing each other are separated from each other. The deposition member 130 is disposed under the wire substrate which is disposed between the first and second reel members 121 and 122. The first and second reel members 121 and 122 multi-turn the wire substrate 10 at an area in which the ceramic precursor film is deposited. For example, the wire substrate 10 travels between the first and second reel members 121 and 122, and is turned by the first and second reel members 121 and 122. The first reel member 121 is adjacent to the first sidewall 111 of the process chamber 110 and the second reel member 122 is adjacent to the second sidewall 112 of the process chamber 110. A structure of the first reel member 121 may be substantially the same as that of the second reel member 122. The first and second reel members 121 and 122 may extend in a direction which crosses the traveling direction of the wire substrate 10.

Each of the first and second reel members 121 and 122 may include reels disposed along the extension direction of the first and second reel members 121 and 122 and combined with each other. The wire substrate 10 is turned by each of the reels. Each of the reels may be independently driven and is rolled by friction with the wire substrate 10. When viewed in a plan, the second reel member 122 may be slightly offset with the first reel member 121 so that the wire substrate 10 is multi-turned by the first and second reel members 121 and 122. The wire substrate 10 travels between the first and second reel members 121 and 122 along the extension direction of the first and second reel members 121 and 122.

Figure 9:
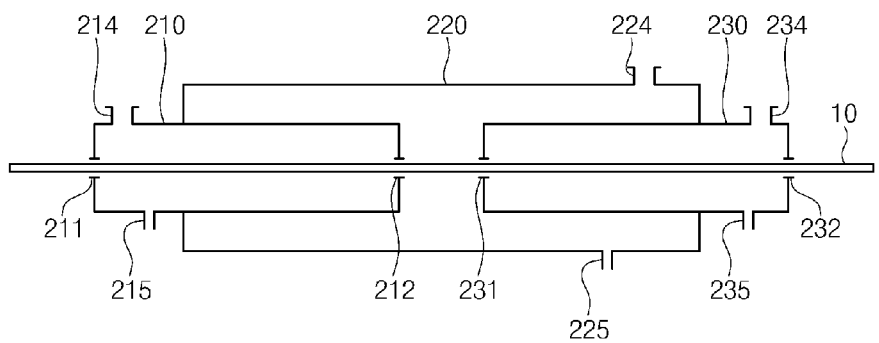
FIG. 9 is a cross-sectional view illustrating a heat treatment unit of an apparatus of forming a ceramic wire in accordance with exemplary embodiments of the inventive concept.

FIG. 9 is a cross-sectional view illustrating the heat treatment unit 300 of the apparatus of forming the ceramic wire in accordance with exemplary embodiments of the inventive concept. Referring to FIG. 9, the heat treatment unit 200 may include a first container 210, a second container 220 and a third container 230 which are adjacent to each other, sequentially. The wire substrate 10 can successively pass the first container 210, the second container 220 and the third container 230. The first container 210 and the third container 230 are separated from each other. A center portion of the second container 220 may be disposed to correspond to the separation region of the first and third containers 210 and 230. The second container 220 may surround a portion of the first container 210 and a portion of the third container 230. The first container 210, the second container 220 and the third container 230 may include a substantially cylindrical tube which is formed using quartz. The first container 210 may be connected to the outgoing part 114 of the film deposition unit 100. The first container 210 may include a first incoming part 211 and a first outgoing part 212 for passing the wire substrate 10, which are respectively formed at both ends of the first container 210, and the third container 230 may include a second incoming part 231 and a second outgoing part 232 for passing the wire substrate 10, which are respectively formed at both ends of the third container 210. The wire substrate 10 enters the first container 210 through the first incoming part 211 of the first container 210 and gets out of the first container 210 through the first outgoing part 212 of the first container 210. Then, after the wire substrate 10 passes through the center portion of the second container 220, the wire substrate 100 enters the third container 230 through the second incoming part 231 and gets out of the third container 230 through the second outgoing part 232.

The first, second and third containers 210, 220 and 230 may respectively include pumping ports 214, 224 and 234. Therefore, the first, second and third containers 210, 220 and 230 may independently maintain a vacuum state. Since oxygen is provided through oxygen supply lines 215, 225 and 235, the oxygen partial pressure of the first container 210, the oxygen partial pressure of the second container 220 and the oxygen partial pressure of the third container 230 may be controlled independently. For example, the oxygen partial pressure of the first container 210 may be lower than the oxygen partial pressure of the third container 230, and the oxygen partial pressure of the second container 220 may be between the oxygen partial pressure of the first container 210 and the oxygen partial pressure of the third container 230. In the second container 220, as going from a first portion adjacent to the first container 210 to a second portion adjacent to the third container 230, the oxygen partial pressure may increase.

The first container 210, the second container 220 and the third container 230 may be provided in a furnace surrounding the first container 210, the second container 220 and the third container 230. The separation region of the first container 210 and the third container 230 may be positioned to correspond to a center portion of the furnace. Accordingly, a temperature at the center portion of the second container 220 may be higher than temperatures in the first and third containers 210 and 230. The temperature in the first container 210 and the temperature of the third container 230 may decrease as it goes far from the center portion of the second container 220.

The heat treatment process illustrated in FIG. 4 will be described with the heat treatment unit 200 illustrated in FIG. 9. While the wire substrate 10 passes through the first container 210 of the heat treatment unit 200, the treatment process along the path 1 may be performed. The first container 210 may have a relatively low oxygen partial pressure. For example, the oxygen partial pressure of the first container 210 may be in a range of about $1 \times 10^{-5}$ Torr to about $1 \times 10^{-4}$ Torr. As going from the first incoming part 211 to the first outgoing part 212, the temperature in the first container 210 may increase. For example, at the first outgoing part 212, the temperature in the first container 210 may be about 800° C. While the wire substrate 10 passes through the second container 220 of the heat treatment unit 200, the treatment process along the path 2 may be performed. For example, the oxygen partial pressure of the second container 220 may be in a range of about $1 \times 10^{-2}$ Torr to about $3 \times 10^{-1}$ Torr. In the second container 220, as going from a first portion adjacent to the first container 210 to a second portion adjacent to the third container 230, the oxygen partial pressure may increase. The temperature at the center portion of the second container 220 may be the same as or higher than about 800° C. While the wire substrate 10 passes through the second portion of the second container 220 and the third container 230 of the heat treatment unit 200, the treatment process along the path 3 may be performed. For example, the oxygen partial pressure of the third container 230 may be in a range of about $5 \times 10^{-2}$ Torr to about $3 \times 10^{-1}$ Torr. In the third container 230, as going from the second incoming part 221 to the second outgoing part 222, the temperature may decrease. The temperature at the second incoming part 221 may be about 800° C.

The heat treatment process illustrated in FIG. 5 will be described with the heat treatment unit 200 illustrated in FIG. 9. The first, second and third containers 210, 220 and 230 are constructed to maintain the vacuum state not independently but dependently. In an exemplary embodiment, the first, second and third containers 210, 220 and 230 may maintain the vacuum state using a single pumping port. In another exemplary embodiment, the first, second and third containers 210, 220 and 230 may be constructed as a single cylindrical container.

While the wire substrate 10 travels from the incoming part of the heat treatment unit 200 to the center portion of the heat treatment unit 200 of the heat treatment unit 200, the treatment process along the path 1 may be performed. While the wire substrate 10 travels from the center portion of the heat treatment unit 200 to the outgoing part of the heat treatment unit 200 of the heat treatment unit 200, the treatment process along the path 2 may be performed. For example, the oxygen partial pressure of the heat treatment unit 200 may be in a range of about $1\times10^{-2}$ Torr to about $2\times10^{-1}$ Torr. The temperature at the center portion of the heat treatment unit 200 may be the same as or higher than about 800° C. In the heat treatment unit 200, as going from the center portion to the incoming part and from the center portion to the outgoing part, the temperature may decrease.

In the exemplary embodiment described above, although the film deposition unit 100, the heat treatment unit 200 and the wire supply/collection unit 300 are constructed as a single so that the wire substrate is successively transported, the inventive concept is not limited to the exemplary embodiment. For example, the wire supply/collection unit may be provided to each of the film deposition unit 100 and the heat treatment unit 200. A reel wound by the wire substrate 10 is provided to the wire supply/collection unit of the film deposition unit 100. The film deposition unit 100 forms the ceramic precursor film on the wire substrate 10. The film deposition unit 100 may have a structure which is different from that of the exemplary embodiment described above. For example, the film deposition unit 100 may be for metal organic deposition (MOD). The reel wound by the wire substrate on which the ceramic precursor film is formed is separated from the film deposition unit 100. The wire substrate 10 on which the ceramic precursor film is formed may be provided to the heat treatment unit 200. Then, the wire substrate on which the ceramic precursor film is formed is heated.

FIGS. 10 through 13 illustrate electrical and structural properties of the ceramic wires formed by methods in accordance with exemplary embodiments of the inventive concept. For example, the ceramic wire may be $SmBa_2Cu_3O_7$, and may have a thickness of about 1.5 µm.

Figure 10:
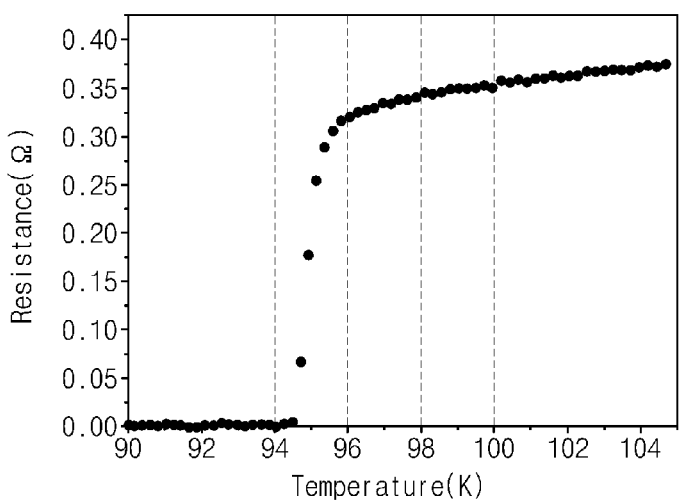
FIGS. 10 through 13 are graphs illustrating electrical and physical properties of a ceramic wire formed by a method in accordance with exemplary embodiments of the inventive concept.
Figure 11:
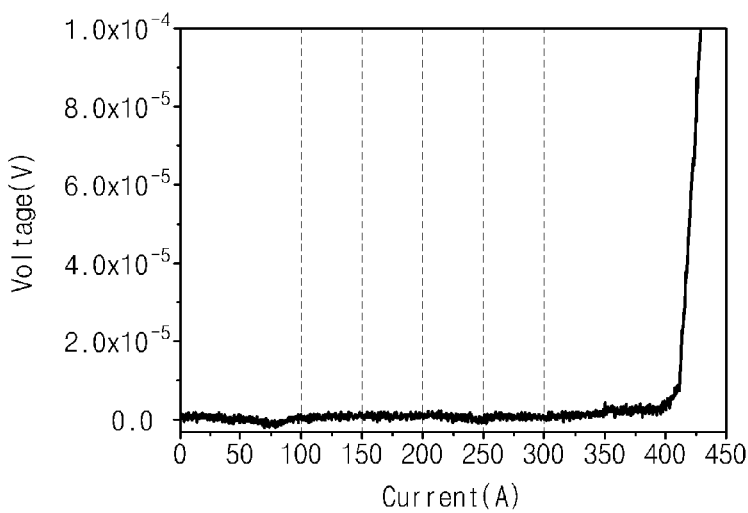
Figure 12:
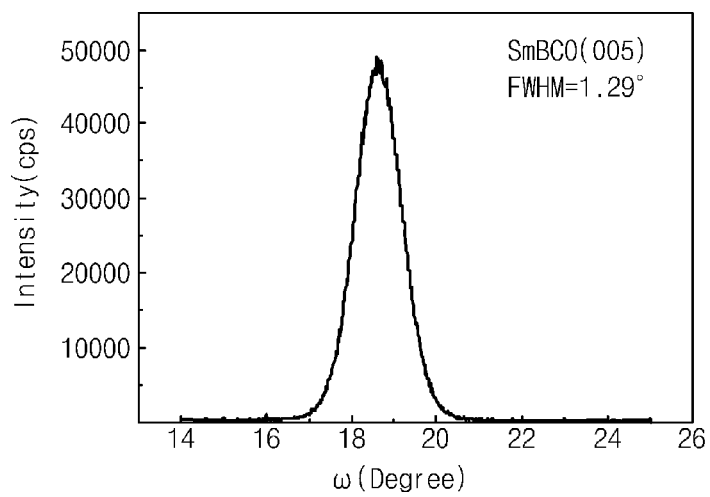
Figure 13:
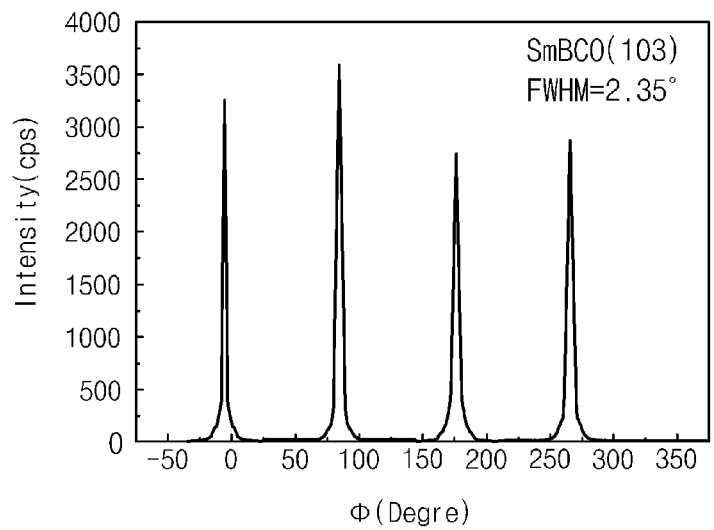

FIG. 10 shows that a critical temperature Tc of the $SmBa_2Cu_3O_7$, ceramic wire formed according to the inventive concept was 94.5 K. FIG. 11 illustrates electrical properties of the $SmBa_2Cu_3O_{7-x}$ ceramic wire formed according to the inventive concept. The measured ceramic wire has a structure in which Ag covers $SmBa_2Cu_3O_{9-x}$. A critical current Tc of the measured ceramic wire was about 410 A and a density of the critical current of the measured ceramic wire was about 2.27 MA/cm². FIGS. 12 and 13 illustrate crystal properties of the $SmBa_2Cu_3O_{7-x}$ ceramic wire. Referring to FIGS. 12 and 13, the crystal properties of the $SmBa_2Cu_3O_{7-x}$ ceramic wire was excellent.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

The invention claimed is:

1. A method of forming a ceramic wire, comprising:
    depositing a ceramic precursor film on a wire substrate; and
    heat-treating the wire substrate on which the ceramic precursor film is deposited, comprising:
    increasing a temperature of the wire substrate and subsequently increasing an oxygen partial pressure of a processing chamber in which the wire substrate is provided, such that the ceramic precursor film is in a liquid state; and
    then decreasing the temperature of the wire substrate to form an epitaxy ceramic film from the liquid ceramic precursor film on the wire substrate,
    wherein the processing chamber comprises a first container, a second container and a third container, which are adjacent in the order named, the heat-treating of the wire substrate is sequentially performed in the first container, the second container and the third container which continuously pass the wire substrate,
    wherein a temperature in the second container is higher than a temperature in the first container and a temperature in the third container,
    wherein an oxygen partial pressure in the first container is lower than an oxygen partial pressure in the third container, and an oxygen partial pressure in the second container is higher than the oxygen partial pressure in the first container and lower than the oxygen partial pressure in the third container, and
    wherein the oxygen partial pressure in the second container increases with distance from a first portion adjacent to the first container to a second portion of the second container adjacent to the third container.

2. The method of claim 1, wherein the depositing of the ceramic precursor film and the heat-treating of the wire substrate are respectively performed in spaces which are separated from each other.

3. The method of claim 1, wherein the temperature in the first container and the temperature in the third container decrease with distance from the second container.

4. The method of claim 1, wherein the temperature in the second container is greater than 800° C. and the oxygen partial pressure in the second container varies in a range of about $5\times10^2$ Torr to about $3\times10^{-1}$ Torr.

5. The method of claim 1, wherein the heat-treating of the wire substrate is performed in the processing chamber which continuously passes the wire substrate, and a temperature in the processing chamber decreases with distance from a center portion of the processing chamber.

6. The method of claim 1, wherein the depositing of the ceramic precursor film comprises providing one of rare earth (RE) elements, barium (Ba) and copper (Cu).

7. The method of claim 1, wherein the ceramic precursor film is formed by a co-evaporation method or a metal organic deposition method.

* * * * *